United States Patent [19]

Youmans et al.

[11] 3,740,900

[45] June 26, 1973

[54] VACUUM CHUCK ASSEMBLY FOR SEMICONDUCTOR MANUFACTURE

[75] Inventors: Albert P. Youmans, Cupertino; Lionel A. Kirton, Saratoga, both of Calif.

[73] Assignee: Signetics Corporation, Sunnyvale, Calif.

[22] Filed: July 1, 1970

[21] Appl. No.: 51,610

[52] U.S. Cl. .................................... 51/235, 269/21
[51] Int. Cl. ............................................ B24b 41/00
[58] Field of Search .......................... 51/235; 279/3; 269/21

[56] References Cited

UNITED STATES PATENTS

| | | | |
|---|---|---|---|
| 3,652,075 | 3/1972 | Thompson | 269/21 |
| 2,998,680 | 9/1961 | Lipkins | 51/235 X |
| 3,131,476 | 5/1964 | Seher | 51/235 X |
| 2,730,370 | 1/1956 | Brewster | 269/21 X |
| 2,405,417 | 8/1946 | Fruth | 51/23 X |
| 2,317,348 | 4/1943 | Wekeman | 51/235 UX |

*Primary Examiner*—Harold D. Whitehead
*Attorney*—Flehr, Hohbach, Test, Albritton & Herbert

[57] ABSTRACT

Apparatus for fabricating a dielectrically isolated semiconductor structure which includes a vacuum chuck assembly for use with a grinding machine with means for supplying a vacuum to the vacuum chuck. The vacuum chuck assembly consists of a body with a bore provided in the body and adapted to be connected to the source of vacuum. The body has a surface with a plurality of vacuum chucks carried thereby. The body and the vacuum chucks are formed with holes and passages which establish communication with the bore in the body so that a vacuum is supplied to the inserts whereby wafers from which the dielectrically isolated semiconductor structures are to be formed can be supported by and retained by the vacuum chucks.

The apparatus also includes a wafer mounting jig which consists of a body having an annular recess therein opening through one side of the body. A flexible diaphragm extends over the annular recess and a cover plate is provided for securing the diaphragm to the body. The cover plate is formed with a plurality of holes overlying the recess and the diaphragm. A relatively non-compressible liquid fills the recess. A plurality of wafer mounting blocks are inserted in the recesses. Means is provided for yieldably retaining the blocks in the body whereby when a force is applied to one of the bodies, equalizing forces will be supplied by the liquid to the other mounting blocks so that all the mounting blocks are forced outwardly by the liquid by substantially equal forces.

The apparatus also includes a mounting press which consists of a plate which is provided with means for cooling and heating the plate. A wafer guide member is provided which has a plurality of holes therein. Means is provided for mounting the guide member on the plate to permit vertical movement of the guide member relative to the plate. A plurality of mounting blocks are mounted in the holes. Each of the mounting blocks is adapted to receive a wafer. A bonding material such as wax is provided on the mounting blocks and pressure plate means is provided for applying pressure to the wafers so that the bonding agent will be uniformly and thinly distributed between each wafer and the associated mounting block.

The method for fabricating a dielectrically isolated semiconductor structure consists of providing a semiconductor body with a first polished planar surface and then covering this polished surface with a protective material which has a substantially uniform thickness over the polished surface. The semiconductor body with the protected polished surface is then mounted on the vacuum chuck assembly with the polished surface facing the vacuum chuck assembly. The vacuum chuck assembly is then placed in a grinding machine and a second planar surface is provided which is parallel to the first polished surface to provide a semiconductor body of the desired thickness. Conventional steps are thereafter utilized to provide the dielectrically isolated semiconductor structure.

5 Claims, 9 Drawing Figures

United States Patent [19]

Youmans et al.

[11] 3,740,900
[45] June 26, 1973

INVENTORS
Albert P. Youmans
Lionel A. Kirton
BY Flehr, Hohbach, Test
Albritton & Herbert
Attorneys INVENTORS
Albert P. Youmans
Lionel A. Kirton
BY
Flehr, Hohbach, Test,
Albritton & Herbert
Attorneys INVENTORS
Albert P. Youmans
Lionel A. Kirton
BY Flehr, Hohbach, Test, Albritton & Herbert
Attorneys

VACUUM CHUCK ASSEMBLY FOR SEMICONDUCTOR MANUFACTURE

BACKGROUND OF THE INVENTION

Various types of apparatus and various methods have been utilized for fabricating dielectrically isolated semiconductor structures. In particular with the apparatus and methods which have been utilized in the past, it has been difficult to stop at a predetermined thickness. In addition, the apparatus and the processes heretofore utilized have been expensive and time consuming. There is, therefore, a need for a new and improved apparatus and method for producing dielectrically isolated semiconductor structures.

SUMMARY OF THE INVENTION AND OBJECTS

The apparatus for fabricating a dielectrically isolated semiconductor structure consists of a vacuum chuck assembly for use with a grinding machine of the type which has means for supplying a vacuum to the vacuum chuck. The vacuum chuck assembly includes a body with a bore formed in the body and adapted to be connected to the source of vacuum. The body is provided with a surface. A plurality of vacuum chucks are carried on the surface of the body. The body and the vacuum chucks are formed with holes and passages establishing communication with the bore and the body so that a vacuum is supplied to the vacuum chucks whereby a wafer can be retained on each of the vacuum chucks to facilitate grinding of the wafers.

The apparatus for fabricating the dielectrically isolated semiconductor structure also includes a wafer mounting jig. The wafer mounting jig consists of a body which has an annular recess formed therein opening through one side of the body. A flexible diaphragm extends over the annular recess. A cover plate is provided for securing the diaphragm to the body. The cover plate is provided with a plurality of holes which overlie the recess and the diaphragm covering the recess. A relatively non-compressible liquid fills the recess. A plurality of wafer mounting blocks are slidably mounted in the recesses. Means is provided for retaining the wafer mounting blocks in the holes in the cover and in engagement with the diaphragm whereby substantially equal forces are applied to the wafer mounting blocks by the diaphragm.

The apparatus for fabricating the dielectrically isolated semiconductor structure also includes a mounting press. The mounting press consists of a plate with means for heating and cooling the plate. A wafer guide member having a plurality of holes therein is provided. Means is provided for mounting the wafer guide member on the plate to permit vertical movement of the guide member relative to the plate. A plurality of wafer mounting blocks are removably mounted in the holes and are adapted to have wafers bonded thereto. Pressure plate means is provided for supplying pressure to the wafers so that the wafers will be bonded with a substantially equal spacing between the wafers and the wafer mounting blocks.

The method for fabricating a dielectrically isolated semiconductor structure consists of providing a semiconductor wafer with a first polished planar surface. Thereafter, a layer of protective material is applied to the wafer so that a layer substantially uniform in thickness overlies the polished surface. The wafer is then secured to the vacuum chuck assembly by having the polished surface face the vacuum chuck assembly so that when the vacuum chuck assembly is placed in the grinding machine, the surface opposite the first polished planar surface will be exposed. Material is removed from the wafer to provide a second surface which is planar and is parallel to the first polished planar surface and so that the wafer has a predetermined thickness. The wafer thereafter is processed in the conventional manner to provide a dielectrically isolated semiconductor structure.

In general, it is an object of the present invention to provide an apparatus for fabricating a dielectrically isolated semiconductor structure which makes it possible to provide first and second planar surfaces which are parallel to each other and which are spaced apart a predetermined distance.

Another object of the invention is to provide an apparatus of the above character which reduce the number of steps required.

Another object of the invention is to provide an apparatus of the above character which makes it possible to precisely mount a plurality of wafers on a vacuum chuck assembly.

Another object of the invention is to provide an apparatus of the above character which makes it possible to mount in a precision manner a plurality of wafers on wafer mounting blocks.

Another object of the invention is to provide an apparatus of the above character in which a substantially uniform pressure can be applied to a plurality of mounting blocks simultaneously while polishing operations are taking place on the wafers carried thereby.

Another object of the invention is to provide an apparatus of the above character in which large numbers of wafers can be processed simultaneously.

Another object of the invention is to provide an apparatus of the above character in which it is possible to polish wafers having a diameter of 2 inches with less than 1 micron deviation across the surface.

Additional objects and features of the invention will appear from the following description in which the preferred embodiments are set forth in detail in conjunction with the accompanying drawings.

DESCRIPTION OF THE PREFERRED EMBODIMENTS

Figure 1:
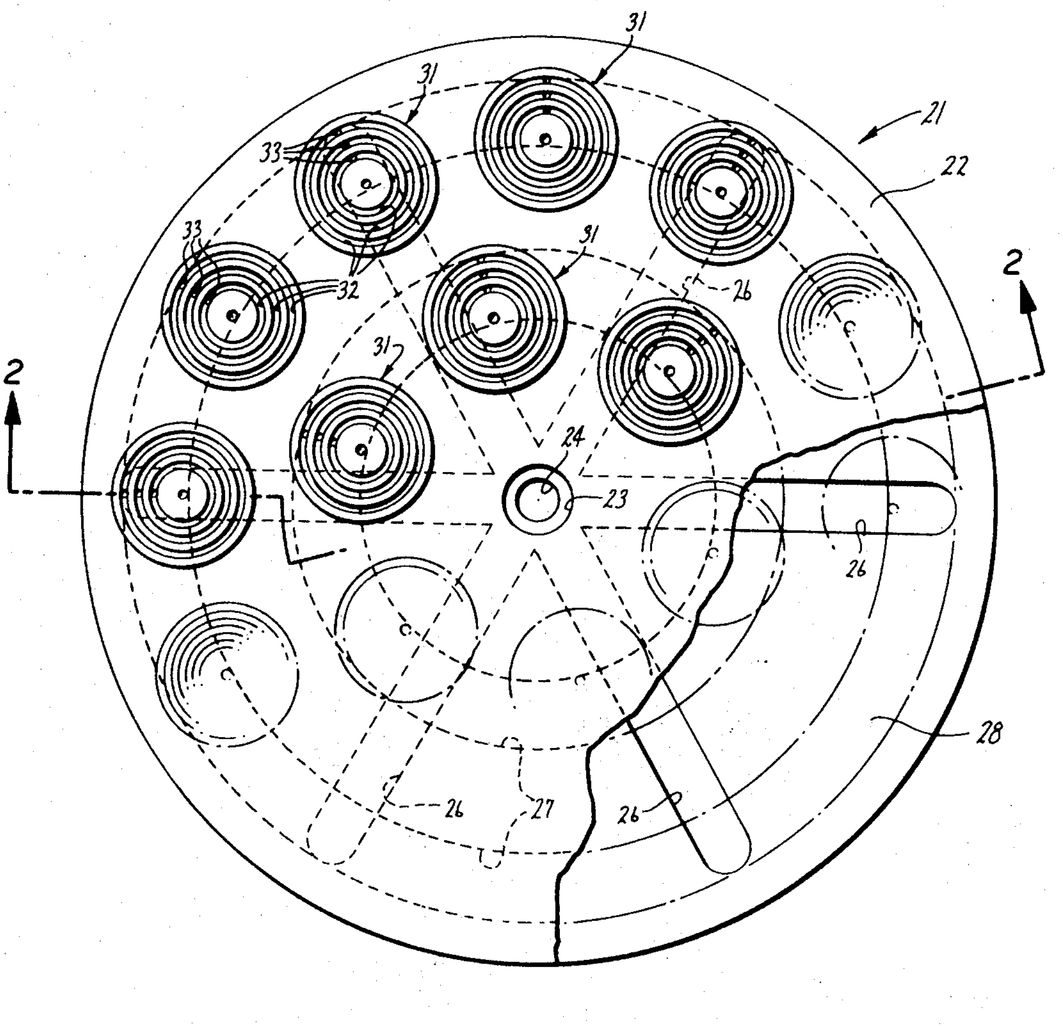
FIG. 1 is a top plan view of a vacuum chuck assembly incorporating the present invention and utilized as a part of the apparatus for fabricating a dielectrically isolated semiconductor structure.
Figure 2:
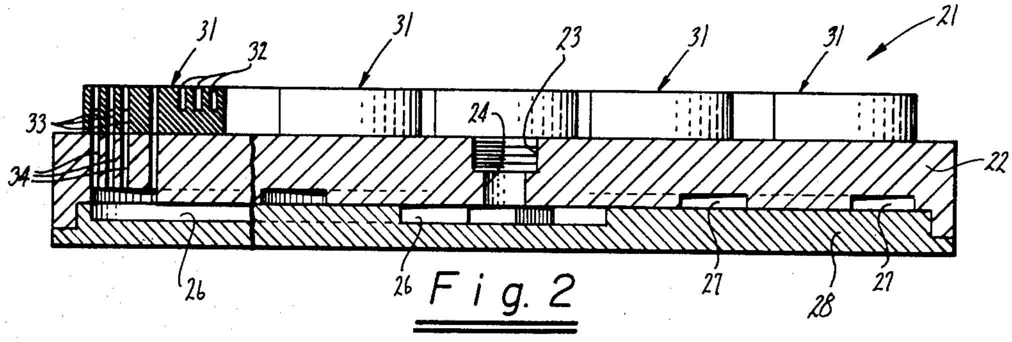
FIG. 2 is a cross-sectional view taken along the line 2—2 of FIG. 1.
Figure 1:
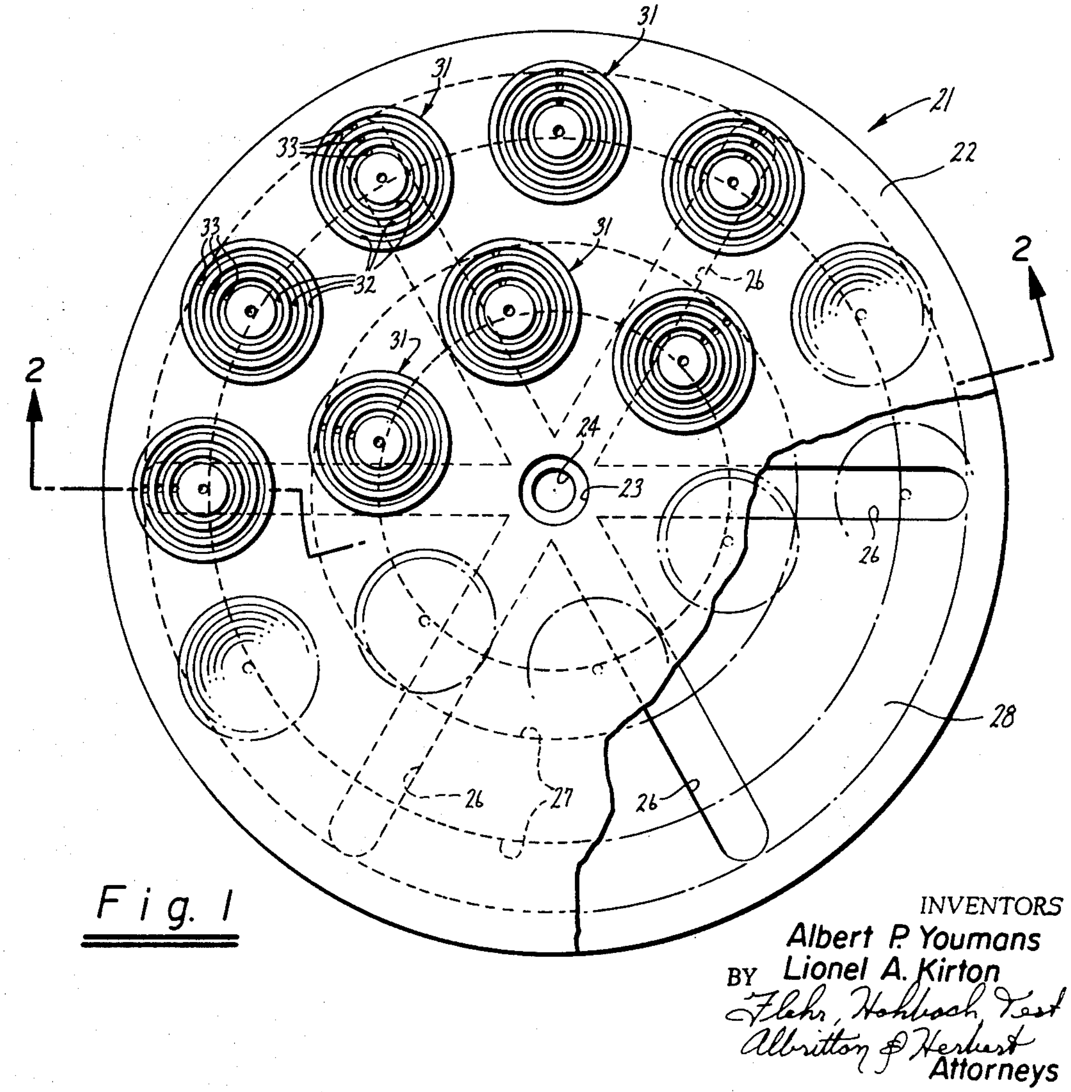

The apparatus for constructing dielectrically isolated semiconductor structures is shown in FIGS. 1 – 7. As is well known to those skilled in the art, semiconductor wafers as, for example, silicon wafers, can be purchased which are already polished on one side so that there is provided a planar polished surface. Alternatively, unpolished wafers can be purchased or prepared and thereafter one side can be polished with conventional polishing equipment. As hereinafter explained in conjunction with the dielectrically isolated semiconductor structure which is disclosed herein, it is desirable to provide a semiconductor wafer which has two planar parallel surfaces. In other words, both the back and front surfaces of the wafer should be parallel to each other. This is accomplished by the use of a vacuum chuck assembly 21 which is shown in FIGS. 1 and 2. As shown therein, this vacuum chuck assembly 21 consists of a body 22 formed of a suitable material such as stainless steel. The body 22 is provided with a large central threaded bore 23 which is adapted to receive a swivel-type connection which is connected to a source of vacuum. The bore 23 is in communication with a bore 24 and the bore 24 is in communication with a plurality of radially extending recesses or channels 26. The channels 26 are provided in a cover plate 28 secured to the body 22 by suitable means such as brazing. A plurality of arcuate recesses or channels 27 arranged annularly of the body 22 are provided in the body 22 and are in communication with the radially extending recesses 26.

A plurality of vacuum chucks 31 are mounted upon the vacuum chuck 21. The chucks 31 are formed of a suitable material such as an alumina ceramic. As can be seen from FIGS. 1 and 2, the chucks 31 are generally in the form of short cylinders and are provided with concentric annular grooves 32 which open through the front sides of the chucks. The back sides of the ceramic chucks 31 are metallized and then they are brazed to the metal body 22. Holes 33 are provided in the chucks 31 during manufacture of the same. Holes 34 are drilled through the body 22 and into the channels 26 and 27. The holes 33 and 34 are aligned so that the bottoms of the grooves 32 are in communication with the channels or recesses 26 and 27 so that a vacuum is supplied to each of the grooves 32. As hereinafter explained, the wafers are placed on the vacuum chucks 31 and are held in place by the vacuum in the grooves 32. Thereafter, the wafer surfaces are ground flat and parallel as hereinafter described such as by placing the vacuum chuck 21 on a conventional Blanchard grinder.

Figure 3:
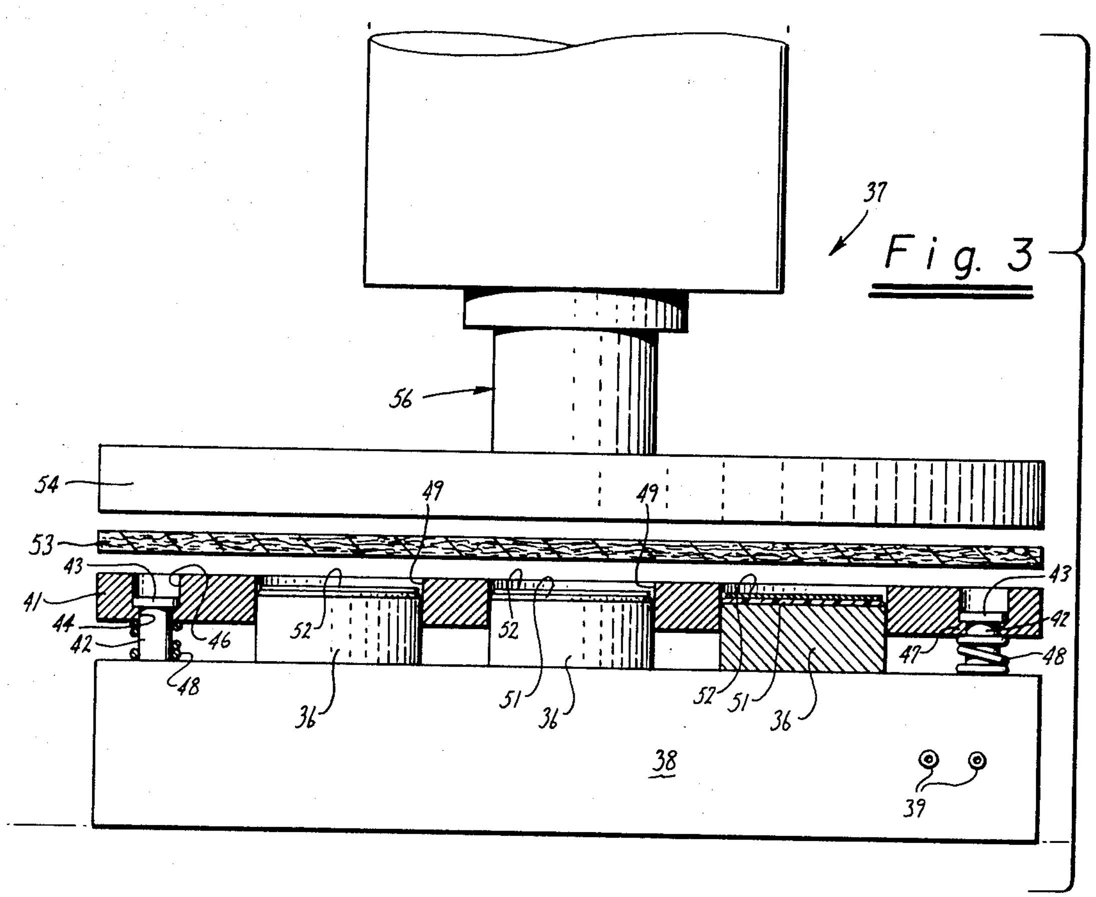
FIG. 3 is a side elevational view, partly in cross-section, of a mounting press incorporating the present invention and also utilized as a part of the apparatus for fabricating a dielectrically isolated semiconductor structure.
Figure 4:
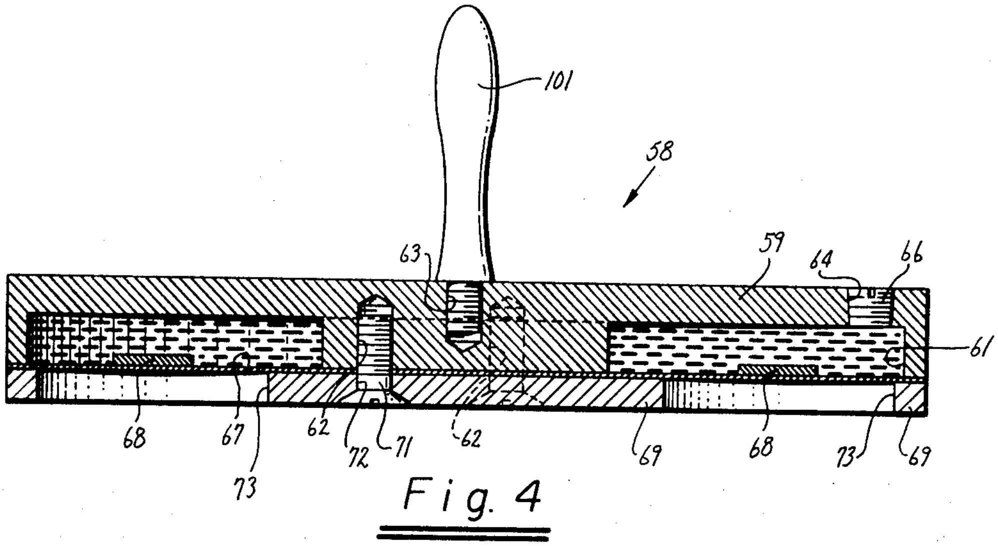
FIG. 4 is a cross-sectional view of a wafer mounting jig incorporating the present invention and also forming a part of the apparatus for fabricating a dielectrically isolated semiconductor structure.

After the surfaces of the wafers have been ground flat and parallel, they are mounted upon individual mounting blocks 36 by the use of a hydraulic mounting press 37 shown in FIG. 3. The mounting press 37 consists of a large plate or block 38 which is of a type which can be heated or cooled relatively rapidly. By way of example, the block 38 can be provided with a plurality of fluid passages therein (not shown) connected to inlet and outlet fittings 39. By appropriate controls of a type well known to those skilled in the art, a heated liquid can be forced through such passages to heat the block or plate 38 and thereafter, if desired, a cooling liquid can be introduced through the same passages to rapidly cool the block 38.

A guide plate having substantially the same size as the block 38 but with a lesser thickness is disposed above the block 38. Means is provided for limiting the upward travel of the guide plate 41 with respect to the block or plate 38 and consists of pins or bolts 42 which are provided with heads 43. The pins or bolts 42 are secured to the block 38 by suitable means such as a press fit or by threading the same into the block. Bores 44 are provided in the guide plate and slidably receive the pins or bolts 42 and larger bores 46 axially aligned with the bores 44 slidably accommodate the heads 43. As can be seen in FIG. 3, the upper limit of the travel of the guide plate 41 is limited by shoulders 47 which cooperate with the heads 43. Yieldable means is provided for yieldably urging the guide plate in its uppermost position and consists of compression springs 48 mounted upon the pins or bolts 42 and having one end engaging the plate or block 38 and having the other end engaging the guide plate 41.

The guide plate 41 is provided with a plurality of precision holes which are adapted to receive the wafer mounting blocks 36. After the large block 38 has been heated and the wafer mounting blocks 36 carried by the guide plate 41 have also been heated, wax 51 in the form of a spot of wax is placed on the top surface of each of the wafer mounting blocks. The wafers 52 which are to be secured to the wafer mounting blocks 36 are dropped through the holes 49 and on top of the wafer mounting blocks 36. Thereafter, a layer 53 of suitable soft material such as felt is placed over the top of the guide plate 41. A pressure plate 54 driven by suitable means such as hydraulic ram 56 is moved toward the felt layer 53 and presses the same against the guide plate 41 to move the guide plate down against the force of the springs 48 so that the felt layer 53 comes into contact with the upper surfaces of the wafers 56 and presses them against the wafer mounting blocks 36 to force out any excess wax between the wafer and the mounting block. It is desirable that as little wax as possible be used for mounting the wafer on the wafer mounting block and that it be as uniform as possible for each mounting block and all of the mounting blocks. As soon as this has been accomplished, cooling fluid is supplied to the block 57 to rapidly cool the same and the wafer mounting blocks therein so that the wax on the wafer mounting blocks will harden. After the wax has hardened, the pressure plate 54 is raised and the layer of felt 53 is removed. The wafer mounting blocks 36 with the wafers 52 carried thereby can then be removed and placed in a wafer mounting jig 58 of the type shown in FIG. 4.

The wafer mounting jig 58 consists of a block or body 59 formed of a suitable material such as stainless steel. The body 59 is provided with an annular recess 61 which opens through one side of the body. On the same side of the body in the central portion thereof, there are provided three spaced threaded bores 62. On the opposite side is a centrally disposed threaded bore 63. A threaded tapered bore 64 is provided on the same side of the body as the bore 63 and is in communication with the annular recess 61 and is utilized for filling the annular recess 61 with a suitable fluid as hereinafter described. A filling plug 66 is mounted in the bore 64.

A flexible diaphragm 67 formed of a suitable material such as rubber is stretched across the top side of the body 59 so that it covers the annular recess 61. A plurality of small permanent magnets 68 are secured to the inner side of the diaphragm 67 by suitable means such as cement and are positioned in a circle so that they are centrally disposed with respect to the annular recess 61 provided in the body 59. A cover plate 69 is provided which overlies the diaphragm 67 and is adapted to be secured to the body 59 by a plurality of screws 71 extending through countersunk holes 72 and threaded into the threaded bores 62. The cover plate 69 holds the diaphragm 67 and the magnets 68 carried thereby in place over the annular recess 61. The cover plate 69 is provided with a plurality of relatively precisely machined holes 73 which are spaced circumferentially in a circle on the cover plate 69 in a position so that they overlie the magnets 68 carried by the diaphragm 67. The mounting blocks 36 with the wafers 52 carried thereby are inserted into the holes 73 and are retained therein by the permanent magnets 68. In the embodiment shown (see FIG. 6), it can be seen that eight holes have been provided. If desired, a smaller or greater number of holes can be utilized. The wafer mounting jig 36 with the wafer mounting blocks 36 disposed therein and having the wafers mounted thereon are placed in a polishing machine to polish the wafers to the final thickness.

Figures 5, 6, 7, 8, 9:
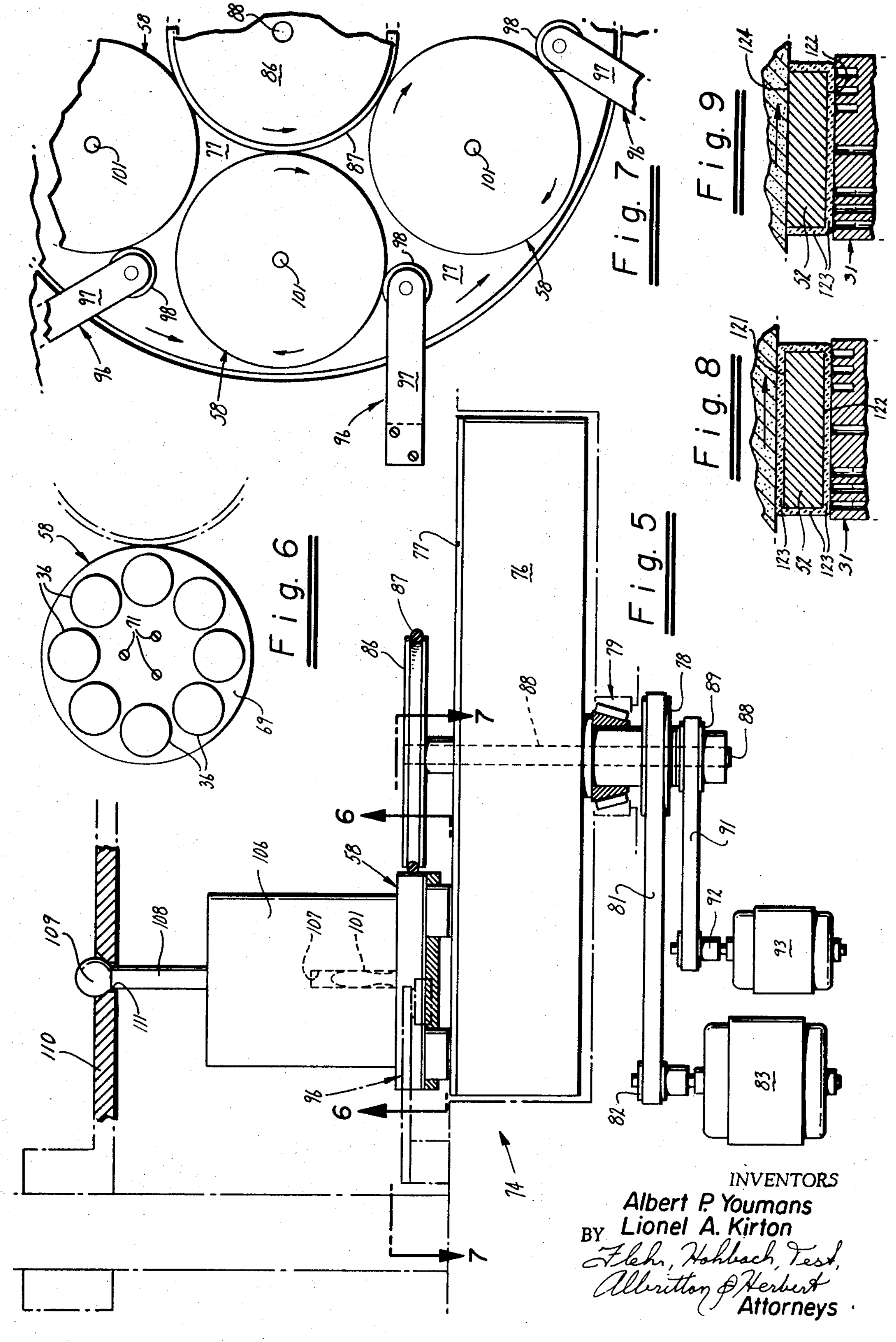
FIG. 5 is a side elevational view, partly in cross-section, showing a polisher with a wafer mounting jig of the type as shown in FIG. 4 carrying mounting blocks with wafers thereon and which are being polished by the polishing machine.
FIG. 6 is a view looking along the line 6—6 of FIG. 5.
FIG. 7 is a view looking along the line 7—7 of FIG. 5.
FIG. 8 is a cross-sectional view showing the manner in which a semiconductor wafer has been processed and the manner in which it is mounted upon the vacuum chuck assembly of the type shown in FIGS. 1 and 2 for carrying out a grinding operation.
FIG. 9 is a cross-sectional view showing a subsequent step in the method after the grinding operation has been completed.

A diagrammatic illustration of the polishing machine 74 is shown in FIG. 5. As shown therein, the polishing machine 74 includes a relatively large circular polishing plate 76 which has mounted on the upper surface thereof a polishing pad 77 which carries a polishing slurry. The polishing plate 76 is rotated by a pulley 78 mounted in a bearing 79. The pulley 78 is driven by a belt 81 which is driven by a pulley 82 driven by a main drive motor 83. A center drive wheel 86 has a circular O-ring 87 mounted on its outer periphery. The drive wheel 86 is driven by a shaft 88 which is rotatably mounted in the plate 77 and extends rotatably through the pulley 78. A pulley 89 is secured to the lower end of the shaft 88 and is driven by a belt 91. The belt 91 is driven by a pulley 92 which is driven by a drive motor 93.

A plurality of idler assemblies 96 are mounted adjacent the polishing plate 77. The idler assemblies consist of an arm 97 which is provided with a pulley 98 which generally overlies the polishing plate 77 and is adapted to be engaged by a wafer mounting jig 58 as hereinafter described.

Each of the wafer mounting jigs 58 is adapted to receive a handle 101 which is threaded into the bore 63. This handle 101 is utilized for placing the wafer mounting jig 58 face down so that the wafers carried by the wafer blocks will engage the polishing pad 77 carried by the polishing plate 76. One of the wafer mounting jigs 58 is placed in front of each of the idler assemblies 96 and in general engagement with the O-ring 87 carried by the center drive pulley 86. As the polishing plate 77 is rotated in a counterclockwise direction as viewed in FIG. 7, the wafer mounting jigs 58 are moved into engagement with the idlers 96 and the center drive wheel 86 and are rotated in a clockwise direction as viewed in FIG. 7. Thus, it can be seen that each of the wafer mounting jigs 58 is rotated in a clockwise direction while the polishing pad 77 is driven in a counterclockwise direction. This type of movement helps to ensure that all the surfaces of the wafers carried by the wafer mounting jig will be polished substantially uniformly.

Means is provided for adjusting the pressure which is applied to the wafer mounting jig to facilitate the polishing operation. Such means consists of a large weight 106 which is provided with a hole 107 on its bottom end to accommodate the pin 101. The weight 106 is provided with a handle 108 with a ball 109 on one end. The handle 108 is centrally mounted in the block 106. A circular plate 110 is provided and has formed therein a plurality of slots 111, each of which is adapted to receive one of the handles 108. Means is provided for raising and lowering the plate 110 and consists of a rack and pinion arrangement (not shown). It can be seen by moving the plate 110 upwardly that the weights 106 carried thereby will be lifted upwardly to expose the handles 101 to permit the removal of the wafer mounting jigs 58 by use of the handles 101.

The polishing machine 74 shown in FIG. 5 can accommodate a plurality of the wafer mounting jigs 58 as, for example, six. Only one of the wafer mounting jigs 58 has been shown in FIG. 5; however, all six of the jigs can be placed upon the polishing pad 77 and all of the weights 106 can be lowered simultaneously onto the jigs 58. These weights serve to apply a predetermined amount of pressure to each of the jigs to force the wafers carried by the jigs into contact with the polishing pad 77 which carries a polishing slurry. The polishing plate 76 can rotate at a suitable speed such as approximately 100 RPM. The center drive wheel 86 is driven at a substantially lower speed as, for example, 5 to 10 RPM which causes rotation of the polishing jig 58 on the polishing pad 77. Thus, it can be seen there is a planetary type of motion between the polishing pad and the polishing jig to help ensure that a uniform polishing motion is applied across the entire surface of the wafer.

When the wafers have been polished to the desired amount, all of the weights can be lifted and then the polishing jigs can be removed to inspect the wafers to determine whether or not they need more polishing.

The use of the apparatus hereinbefore described in producing dielectrically isolated semiconductor devices will now be briefly described as follows. Wafers 52 of a conventional type such as single crystal silicon can be readily purchased. Such wafers can be mounted upon a conventional mounting block (not shown) by suitable means such as beeswax and then placed in a grinding machine of a conventional type and the exposed surfaces 121 (see FIG. 8) are ground flat to ensure that there is a planar surface one each of the wafers for polishing. The mounting block with the wafers still mounted thereon are then placed in a polishing machine similar to the one which is shown in FIG. 5 and one of the surfaces 121 of the wafers is polished to provide a polished surface 122. The wafers are then demounted by melting the wax and then cleaning. If desired, the wafers can be purchased with one surface already polished.

Wafers with one surface polished are oxidized in a conventional oxidation furnace to form a silicon dioxide layer 123 which compasses the wafer. It is desirable that this silicon dioxide layer have a sufficient thickness so as to protect the polished surface 122 which has just been prepared from scratches which may occur during the subsequent grinding operation. For example, a thickness of 2 microns has been found to be suitable. This polished surface should have less than 1 micron deviation across the surface of the wafers.

After the wafers have been oxidized, they are placed with the polished oxide surfaces 122 facing the vacuum chuck 31 as shown in FIG. 8. This vacuum chuck assembly 21 is placed in a conventional grinding machine and the other surface 121 of the wafer is ground to remove the silicon dioxide layer 123 and also to remove a certain amount of the single crystal silicon wafer itself to provide another flat or planar surface 124 which is parallel to the polished surface 122 which had been previously prepared. The wafer is also ground so that it has a desired thickness. It is important to know this thickness because this information is utilized to calculate where the plane of the surface which has just been ground is located.

After the planar surfaces 122 and 124 have been provided and the wafers have been ground to the desired thickness, the wafers are removed from the vacuum chuck 31. The oxide remaining on the wafer is stripped in a conventional manner such as by placing the wafers in an etch and then the wafers are cleaned to remove any dirt and residue which may have been deposited on the wafer during the grinding operation. Any scratches which may have been placed in the oxide coating by the grinder are removed when the oxide is stripped so that there remains the polished surface 122 which previously had been provided.

The wafers are then re-oxidized and are masked for isolation moats and then the isolation moats are etched into the silicon dioxide layer and into the wafer to provide the moats. The wafer is then re-oxidized so that the silicon dioxide layer grows in the moats and forms a continuous silicon dioxide layer over the polished surface and into the moats. A support structure such as one of polycrystalline silicon is then formed upon the silicon dioxide surface which has the moats formed therein. The side of the silicon dioxide opposite the polycrystalline side is then placed on the vacuum chuck 31 shown in FIGS. 1 and 2 and the polycrystalline material which forms the support structures is ground flat and parallel to the single silicon surface. Again, this surface should be better than 1 micron tolerance across the wafer. The wafer is then turned over on the vacuum chuck 31 and the single crystalline silicon is ground to within approximately 20 microns of the final desired thickness of the wafer.

The wafers are then removed from the vacuum chuck assembly 21 and then mounted individually on wafer mounting blocks 36 with the mounting press shown in FIG. 3. The mounting blocks 36 with the wafers 52 thereon are inserted in the wafer mounting jigs 58. The wafer mounting jigs 58, after they have been loaded with mounting blocks carrying wafers, are placed on the polishing machine 74 shown in FIG. 5 and are polished for a predetermined length of time. The wafers are then inspected to see whether or not the silicon dioxide layer which is to form the isolation for the isolated regions is exposed. If desired, the wafers can be sorted into groups depending on how much more additional polishing is required and then polished to the final desired thickness. In this way, dielectrically isolated islands are formed which are formed of the original material as, for example, single crystal silicon, which are carried within a support body formed of polycrystalline silicon. In the bottom of the islands is the polished surface which was first prepared.

By utilization of the apparatus and the methods herein before described, it is possible to maintain parallelism throughout the process even though there is a transfer from one reference surface from one side to the other throughout the process. During the process undamaged polished surfaces are provided. This is particularly desirable in conjunction with an anisotropic etch which is utilized for forming the isolation moats. As is well known to those skilled in the art, if there is work damage in the surface, the anisotropic etch will not follow the crystal planes.

In a finished device, the single crystal silicon islands normally would have a thickness ranging from 20 to 30 microns, whereas the wafer itself would have a thickness of approximately 8 mils. By maintaining the surfaces of the wafer flat and parallel, it is possible to hold the thickness of the single crystalline semiconductor islands within 2 microns. As is well known to those skilled in the art, it is desirable to control this thickness relatively precisely. If the islands are too thin, the breakdown voltage of the device will be too low. If it is too thick, the saturation voltage will be too high.

After the single crystal semiconductor islands have been formed, integrated circuits can be built into the islands in a manner well known to those skilled in the art. For example, an oxide layer can be grown over the islands, the islands can then be masked repeatedly and etched for the desired diffusion steps to form the active and passive devices within the islands. Metallization can then be deposited on the silicon dioxide insulating layer and holes formed in the silicon dioxide layer to make contact with the diffused regions in the islands to provide a completed integrated circuit.

The apparatus and process hereinbefore described has several advantages over the apparatus and methods heretofore utilized. The number of wafer mounting and transferring steps have been reduced. For example, after the first polish to the surface has been provided on the wafer, there is only one wax mounting step required. By the use of the mounting press shown in FIG. 3, it is possible to provide more reproducible mountings of the wafers with a relatively uniform thickness of wax which is utilized for holding the wafers on the mounting blocks 36. The apparatus also has been constructed in such a manner that a much larger quantity of wafers can be processed in a single operation than was possible previously. In addition, the time required for completing the various processes has been substantially reduced. The use of the wafer mounting jigs 58 is particularly advantageous in making it possible to provide the planar parallel polished surfaces required on the wafers. The weight which is placed on the wafer mounting jig 58 in the polishing machine is uniformly transferred to all of the wafers carried by the mounting blocks 36. This is because the hydraulic fluid which is carried within the recess of the block or body 61 causes the pressure to be uniformly applied to all of the mounting blocks. Thus, for example, if one of the mounting blocks 36 is pushed inwardly, the pressure will be equalized on all of the other mounting blocks. This greatly helps to ensure that all of the individually mounted wafers carried by the wafer mounting jig 58 will be forced downwardly with the same pressure against the polishing pad 77 so that they all will be polished relatively uniformly with the desired planar parallel surface. This also helps to ensure that all of the wafers will be polished to substantially the same thickness at the same time by the polishing machine.

The use of vacuum chucks which will not deform is also advantageous in ensuring that the wafers will always be ground with planar parallel surfaces.

By the utilization of wafers which have been provided with a protective coating, such as the silicon dioxide layer hereinbefore described, it is possible to protect the polished surface so that it will not be damaged during the polishing and grinding operations.

We claim:

1. In apparatus for fabricating a dielectrically isolated semiconductor structure from semiconductor wafers, a vacuum chuck assembly for use with a grinding machine provided with a source of vacuum for connection to the vacuum chuck assembly, said vacuum chuck assembly including a metallic body, said body being formed with a bore adapted to be connected to the source of vacuum in the grinding machine, said body having a planar substantially uninterrupted surface, a plurality of separate vacuum chucks formed of a substantially non-deformable material which is harder than the body mounted on and carried by the surface of the body so that there are free spaces between the vacuum chucks, said vacuum chucks having exposed planar surfaces lying in a common plane, said body and said vacuum chucks being formed with holes in registration with each other establishing communication with the bore in the body so that a vacuum is supplied to said vacuum chucks whereby wafers may be held in place directly on the planar surfaces of the vacuum chucks while grinding operations are being carried out on the wafers, said vacuum chucks being formed with a plurality of concentric annular grooves opening through said planar surfaces and in communication with said holes.

2. Apparatus as in claim 1 wherein said vacuum chucks are formed of a ceramic.

3. Apparatus as in claim 2 wherein said vacuum chucks are provided with metallization on the back side and wherein said vacuum chucks are brazed to the body.

4. An apparatus for fabricating a dielectrically isolated semiconductor structure, a vacuum chuck assembly for use with a grinding machine provided with a source of vacuum for connection to the vacuum chuck assembly, said vacuum for connection to the vacuum chuck assembly, said vacuum chuck assembly including a body, said body being formed with a bore adapted to be connected to the source of vacuum in the grinding machine, said body having a planar surface, a removable cover plate mounted on said body, said body and said cover plate in combination being formed to provide radially extending channels which are in communication with said bore, said body and said cover also being formed with a plurality of annular channels which are in communication with said radially extending channels, a plurality of separate vacuum chucks mounted on and carried by the surface of the body with free spaces therebetween, said body having a plurality of holes spaced at points extending into said annular channels, each of said vacuum chucks having a plurality of holes in registration with the holes in said body so that communication is established with the bore in the body whereby a vacuum can be applied to the vacuum chucks, said vacuum chucks having planar surfaces lying in a common plane through which said holes extend whereby wafers may be held in place on the vacuum chucks while grinding operations are being carried out on the wafers.

5. Apparatus as in claim 4 wherein each of said vacuum chucks is provided with a plurality of annular grooves opening through the planar surfaces of said vacuum chucks.

* * * * *